United States Patent [19]

Klein

[11] Patent Number: 5,617,093
[45] Date of Patent: Apr. 1, 1997

[54] SWITCHED CAPACITOR ANALOG CIRCUITS WITH LOW INPUT CAPACITANCE

[75] Inventor: Hans W. Klein, Pleasanton, Calif.

[73] Assignee: IMP, Inc., San Jose, Calif.

[21] Appl. No.: 315,478

[22] Filed: Sep. 30, 1994

[51] Int. Cl.$^6$ .................................................. H03M 1/00
[52] U.S. Cl. ........................................... 341/172; 341/150
[58] Field of Search ..................................... 341/172, 144, 341/150, 166, 155

[56] References Cited

U.S. PATENT DOCUMENTS

| | | |
|---|---|---|
| 4,659,928 | 4/1987 | Tew . |
| 4,758,987 | 7/1988 | Sakui . |
| 5,072,219 | 12/1991 | Boutaud et al. . |
| 5,142,238 | 8/1992 | White . |
| 5,220,170 | 7/1993 | Cox et al. . |
| 5,376,936 | 12/1994 | Kerth et al. ............................ 341/150 |

FOREIGN PATENT DOCUMENTS

| | | |
|---|---|---|
| 0078601 | 5/1983 | European Pat. Off. . |
| 0217284 | 4/1987 | European Pat. Off. . |
| 0611165A | 5/1994 | European Pat. Off. . |

*Primary Examiner*—Brian K. Young
*Attorney, Agent, or Firm*—Majestic, Parsons, Siebert & Hsue

[57] ABSTRACT

In a circuit cell of a type which transfers packets of charge through the circuit that are proportional to the magnitude of periodic samples of a signal, a technique for maximizing the circuit cell's input impedance, and particularly to minimize its effective input capacitance, by providing a supplemental source to charge its input capacitor to a level that approximates that which a current sample of the input voltage would cause it to reach. This minimizes the amount of input current drawn by the circuit to charge its input capacitor, the input current during one signal sample generally being only an amount required to increase or decrease the charge level of the prior sample which is provided by the supplemental charge source. Thus, the input capacitor may be made large enough to provide a desired signal-to-noise level and sufficient accuracy, while still providing a high impedance input characteristic. In one embodiment, the supplemental charge comes from an output of the circuit. In another embodiment, the supplemental charge comes from an extra amplifier connected to the input signal.

24 Claims, 6 Drawing Sheets

SWITCHED CAPACITOR ANALOG CIRCUITS WITH LOW INPUT CAPACITANCE

BACKGROUND OF THE INVENTION

This invention relates generally to electronic switched capacitor (charge coupled) voltage signal integrated circuits.

There are applications where it is beneficial to process a continuous voltage signal by first periodically sampling the signal and then processing packets of charge with levels that are proportional to the magnitude of the samples. The charge packets are transferred through such a circuit from capacitor to capacitor by a synchronous operation of switches in between the capacitors. One advantage of a switched capacitor circuit is that no resistors are usually required, thereby reducing circuit area and parasitic effects associated with resistors.

However, the predominate use of capacitive elements in such circuits causes impedances at various circuit nodes to be low at higher signal frequencies. Particularly, an input to such a circuit presents a high input capacitance which can result in drawing more current than desired. Therefore, it is a primary and general object of the present invention to provide switched capacitor circuits with a high input impedance, primarily a low input capacitance, without sacrificing the performance of the circuit.

SUMMARY OF THE INVENTION

This and additional objects are accomplished by pre-charging an input capacitor of a switched capacitor circuit to a level that approximates that to which an input voltage signal sample will charge it. The input current that is required to charge the input capacitor is then primarily only that necessary to adjust the charge on the pre-charged input capacitor on account of a change in the input voltage signal level from the time of the last sample. The low input current then results in a high apparent input impedance, particularly resulting in a low effective input capacitance. This is accomplished without having to reduce the size of the input capacitor from that desired for proper operation of the circuit.

According to one embodiment of the invention, a separate amplifier circuit is the source of this pre-charge, providing an amount of charge in response to monitoring the input signal with a high impedance input. According to another embodiment of the invention, no additional amplifier is required, and thus the additional pre-charging circuitry is simplified and reduced. In this second embodiment, the output of an existing amplifier within the switched capacitor circuit is used to pre-charge the input capacitor.

Additional objects, advantages and features of the present invention will become apparent from the following description of its preferred embodiments, which description should be taken in conjunction with the accompanying drawings.

DESCRIPTION OF THE PREFERRED EMBODIMENTS

Figure 1:
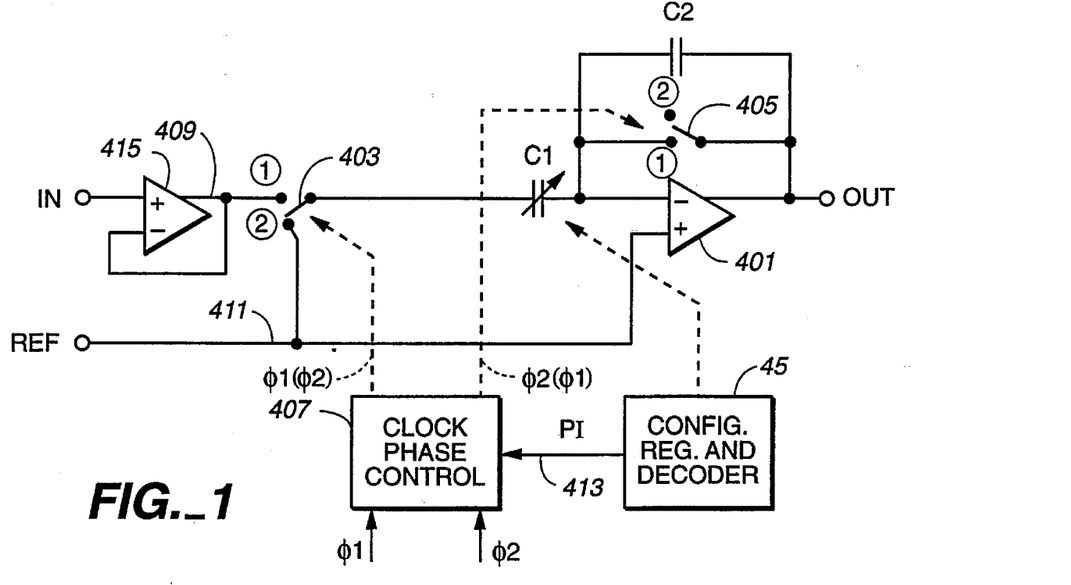
FIG. 1 a schematic diagram of a switched capacitor amplifier of a type which the present invention can serve as an improvement.

The basic mode of operation of known charge mode (switched capacitor) circuits is the transfer of packets of charge from capacitor to capacitor by use of appropriate repetitive switching. The charge level transferred at a particular instant is proportional to the value of the voltage signal at that time. FIG. 1 shows an example of such a circuit which has some configurable characteristics. As such, it is useful as a functional module in an integrated circuit chip having many such configurable modules which may be interconnected various ways. The FIG. 1 circuit is a variable gain amplifier which has a high input impedance, including a low effective input capacitance, and a low output impedance.

The circuit of FIG. 1 includes an amplifier 401 having a variable input capacitor C1 and a feedback capacitor C2 extending from an output to its inverting input. Two switches 403 and 405 are respectively provided in series with the capacitor C1 in the input circuit and across the capacitor C2 in the feedback circuit. The switches 403 and 405 are synchronously switched in response to two active clock signals $\phi 1$ and $\phi 2$ from a circuit 407. These two clock signals are 180° out of phase with each other and cause switches 403 and 405 to switch simultaneously between their indicated respective positions 1 and 2. When these switches are in their position 1, when the clock phase $\phi 1$ is active, the switches cause the input capacitor C1 to be charged to a value proportional to an input voltage in a line 409 with respect to a reference signal in a line 411. In the next part of the cycle, when the clock phase $\phi 2$ is active, the switches 403 and 405 are moved to their indicated positions 2, thereby connecting the input capacitor C1 to the reference line 411 and removing the short across the feedback capacitor C2. This causes charge to be transferred from the capacitor C1 to the capacitor C2. The cycle is then repeated by moving the switches back to their position 1, and so forth. The gain of the FIG. 1 amplifier circuit is determined by a ratio of the values of the capacitors C1 and C2, just as if resistances were being used in place of the capacitors in a continuous voltage mode circuit.

The gain of the amplifier circuit in FIG. 1 can be made programmable by providing a configuration register 45 which controls the value of the capacitor C1 from data stored in it. The variable capacitor C1 is preferably implemented by use in a number of fixed capacitors in different but related values which are combinable by operation of various switches to provide a range of capacitance in incremental steps. The configuration data for a functional module cell of a multi-cell chip also contains one bit of data which controls, through a line 413, the phases of the switch controlling clock signals. That is, a control signal of the line 413 controls, through circuits 207, the absolute phases of the φ1 and φ2 clock signals. The purpose of this is to permit adjustment of the signal sampling phases for proper coupling of signals between charge mode modules.

In order to charge the input capacitor C1 when the switch 403 is in its position 1, current flows in the input line 409. If a high impedance input is desired, a high input impedance buffer amplifier 415 is inserted in the path of the input signal.

Figure 2:
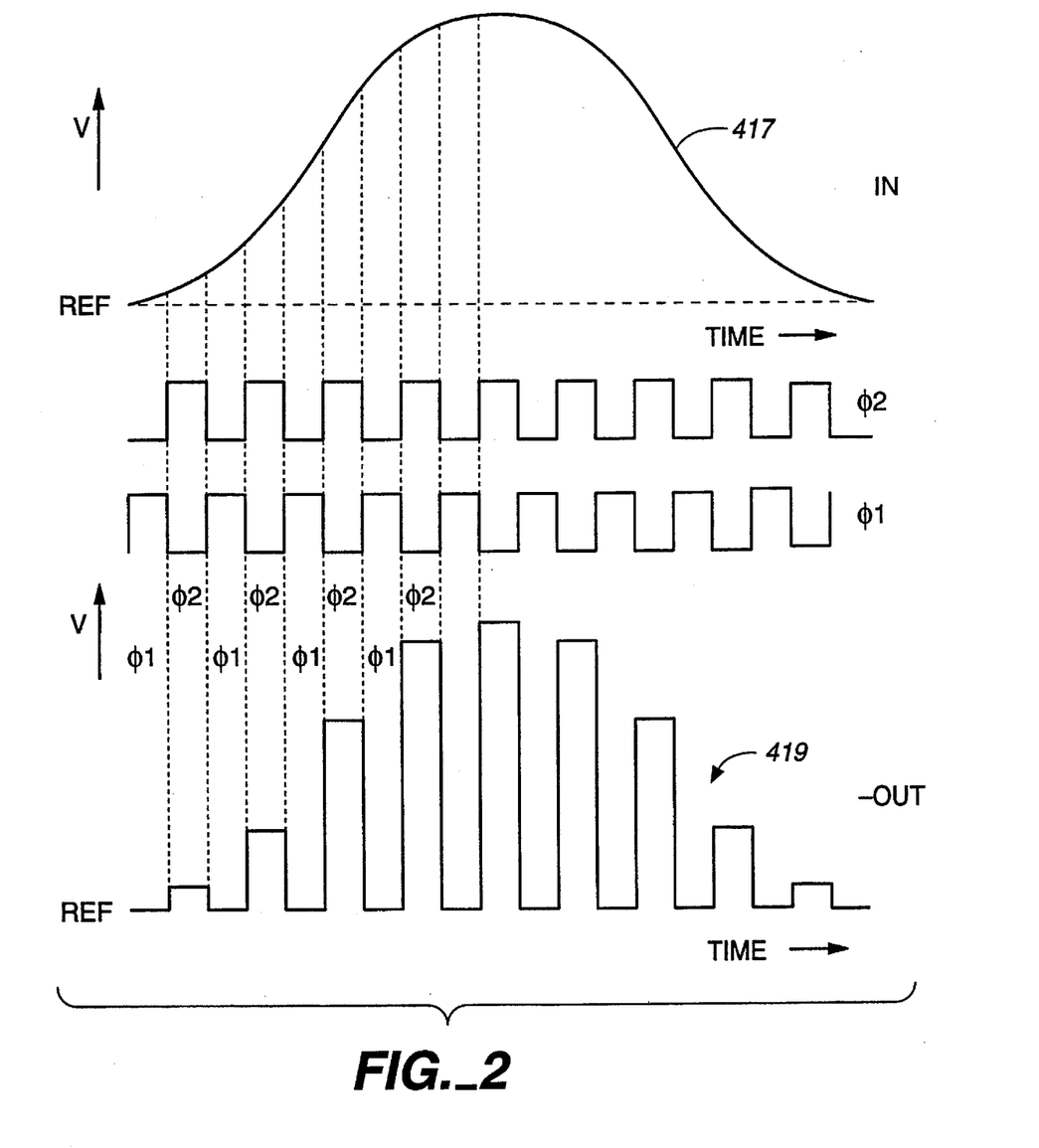
FIG. 2 is a timing diagram which shows one particular mode operating the circuit of FIG. 1.

Referring to FIG. 2, a single example of the operation of the circuit of FIG. 1 is given. An input voltage 417 is effectively sampled at a rate determined by the clock signals φ1 and φ2, to result in an output signal 419. It will be noticed that the output signal, corresponding to the charge stored in the capacitor C2, follows the input voltage 417 during the half of the clock switching cycle where the switches 403 and 405 of FIG. 1 are in their position 2. The output is thus valid when the clock signal φ2 is active. When in position 1, the switch 405 shorts out the capacitor C2 thereby discharging it, and causes the output signal of the amplifier 401 to fall to the reference level voltage in the line 411. This is commonly referred to as a "return-to-zero" (RTZ) signal, since the reference represents the zero level.

Although the input buffer amplifier 415 (FIG. 1) provides the usually desirable high impedance input, it is desirable in most cases to be able to eliminate the need for such an amplifier. This can be done if the current drawn through the input line 409, which occurs during the interval φ1 when the capacitor C1 is being charged, can be reduced to a value near zero. This current can be significant since the capacitor C1 is substantially totally discharged during the immediately preceding phase φ2 when both of its sides are maintained at the reference potential of the line 411. (The amplifier 401 maintains its inverting input at the potential of line 411 which is connected to its non-inverting input.) Therefore, enough current is required in the line 409 during the phase φ1 to provide a full charge to the capacitor C1. A reduction of the level of this input current increases the input impedance of the amplifier, including lowering its effective input capacitance. If this input current is low enough, the input buffer amplifier 415 is unnecessary.

One way to minimize the input current in the line 409 of the circuit of FIG. 1 is to make the value of the input capacitor C1 very small. However, it is usually desirable to be able to size the capacitor C1 without that constraint since the accuracy of the circuit increases with larger values of input capacitance. In order to both minimize the input current and allow the input capacitor to be made as large as required to obtain a desired level of accuracy, the circuit of FIG. 1 is modified to charge the input capacitor from some other source to a level approximating that of the input signal. That is, the input capacitor C1 is pre-charged during the phase φ1, after being discharged during the phase φ2, to a level approximating that of the immediately previous sample of the input voltage. Thus, the current drawn from the input during each phase φ1, when the capacitor C1 is connected to the input, is primarily only that necessary to supply enough charge to change the capacitor C1 charge level an amount corresponding to a change in the input voltage which has occurred since the last sample of the input signal. The circuit's input capacitance then appears to be low, and thus its overall input impedance high, without use of the buffer amplifier 415 or other such device.

Figure 3:
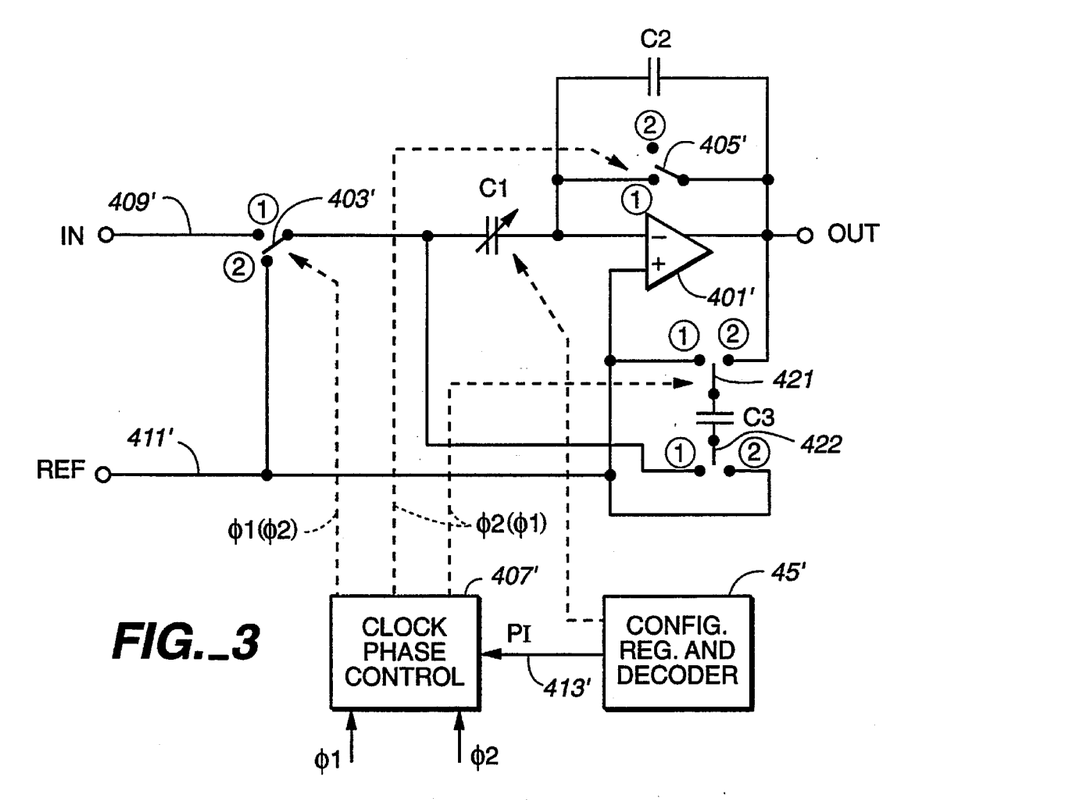
FIG. 3 is a schematic diagram of a first embodiment of a switched capacitor amplifier implementing the pre-charging feature of the present invention.

FIG. 3 shows a general example of such a modification of the charge mode amplifier of FIG. 1. In place of the input amplifier 415 of FIG. 1 is a third capacitor C3 and controlling switches 421 and 422. As indicated in FIG. 3, the capacitor C3 is charged by the output voltage of the amplifier 401' when the switches 421 and 422 are in their position 2. This charging occurs simultaneously with charge being transferred from the input capacitor C1 to the feedback capacitor C2 when the switches 203' and 205' are also in the position 2 (clock phase φ2). When these three switches are simultaneously moved to their position 1 (clock phase φ2), in response to the controlling clock signals, a voltage across the pre-charge capacitor C3 is applied to the capacitor C1 in parallel with an input voltage in the line 409'. This significantly reduces the amount of current flowing in the line 409'. If the input voltage is unchanging, this current will be substantially zero. If the voltage is changing, which is the normal case, the current on the input line 409' will be a small amount related only to the change in the input voltage currently being sampled from that which was sampled in the previous cycle. In many applications, this sufficiently decreases the effective input capacitance between the lines 409' and 411' that the additional overhead of a high impedance buffer amplifier 415 (FIG. 1) becomes unnecessary.

The gain A of the FIG. 3 amplifier is, as with that of FIG. 1, equal to a ratio of the values of the capacitances C1 and C2:

$$A = \frac{C1}{C2}$$

The value of the pre-charge capacitor C3, in order to minimize the effective input capacitance and otherwise maximize the input impedance of the circuit, should be:

$$C3 = \frac{C2}{1 - \frac{1}{A}}$$

However, it has been found that the desired input characteristics are approximated for all gain settings without having to make the capacitance C3 variable, when the values of C3 and C2 are made to be the same.

When the charged capacitor C3 is switched into a parallel connection with the input capacitor C1, at the beginning of the clock phase φ2, there will be a short current spike through the input line 409' as a redistribution of charge between the capacitors C3 and C1 is begun. However, the resistance of the current transfer path between the capacitors C3 and C1 is made to be very small in order to minimize the R-C time delay of this charge transfer. Thus, both the duration and magnitude of these input current spikes are minimized. The goals of providing a circuit having a very small effective input capacitance and otherwise a large input impedance are thus met.

Figure 6:
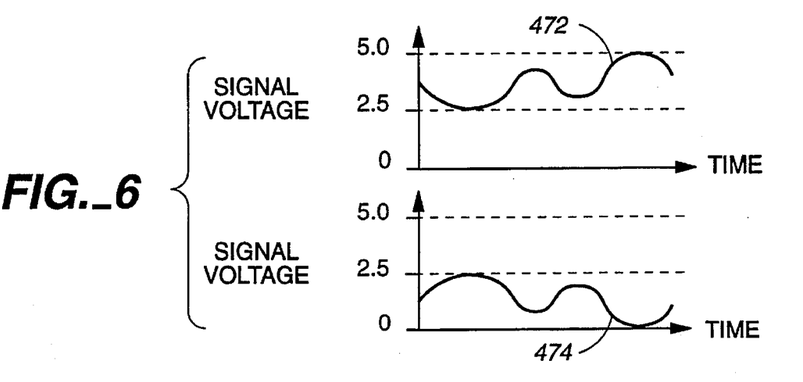
FIG. 6 illustrates a fully differential voltage signal with which the embodiment of FIGS. 4 and 7 operate.

The circuit of FIG. 3 is a general one, designed to receive and output single ended signals. A counterpart circuit for handling fully differential signals is given in FIG. 4. Such a differential signal is illustrated in FIG. 6. Complementary voltage variations are carried by a pair of lines with respect to a base voltage level, such as 2.5 volts. The voltage in one line of the pair moves in a positive direction from the base level to a maximum of some upper level, such as 5.0 volts, while the voltage in the other line simultaneously moves in a negative direction from the base level and to some lower level, such as zero volts, for example. Such a differential signal is inputted to the circuit of FIG. 4 in a pair of lines 473 and 475, a positive going signal 472 (FIG. 6) in line 473 and a negative going signal 474 in line 475. Similarly, such a differential signal is outputted from the circuit in lines 499 and 501.

An operational transconductance amplifier (OTA) 471 has one input connected to a line 482 which is in series with an variable input capacitor C4p and a switch 477 to the input line 473. Similarly, a second input of the OTA 471 is connected in series with an variable input capacitor C4n and a switch 479 to the input line 475. Respective positive going and negative going output lines 499 and 501 are connected to differential outputs of the OTA 471. The positive going (upper half of FIG. 4) and the negative going (bottom half of FIG. 4) portions of the amplifier are symmetrical in structure. Each portion generally operates as described with respect to FIG. 3.

Figure 4:
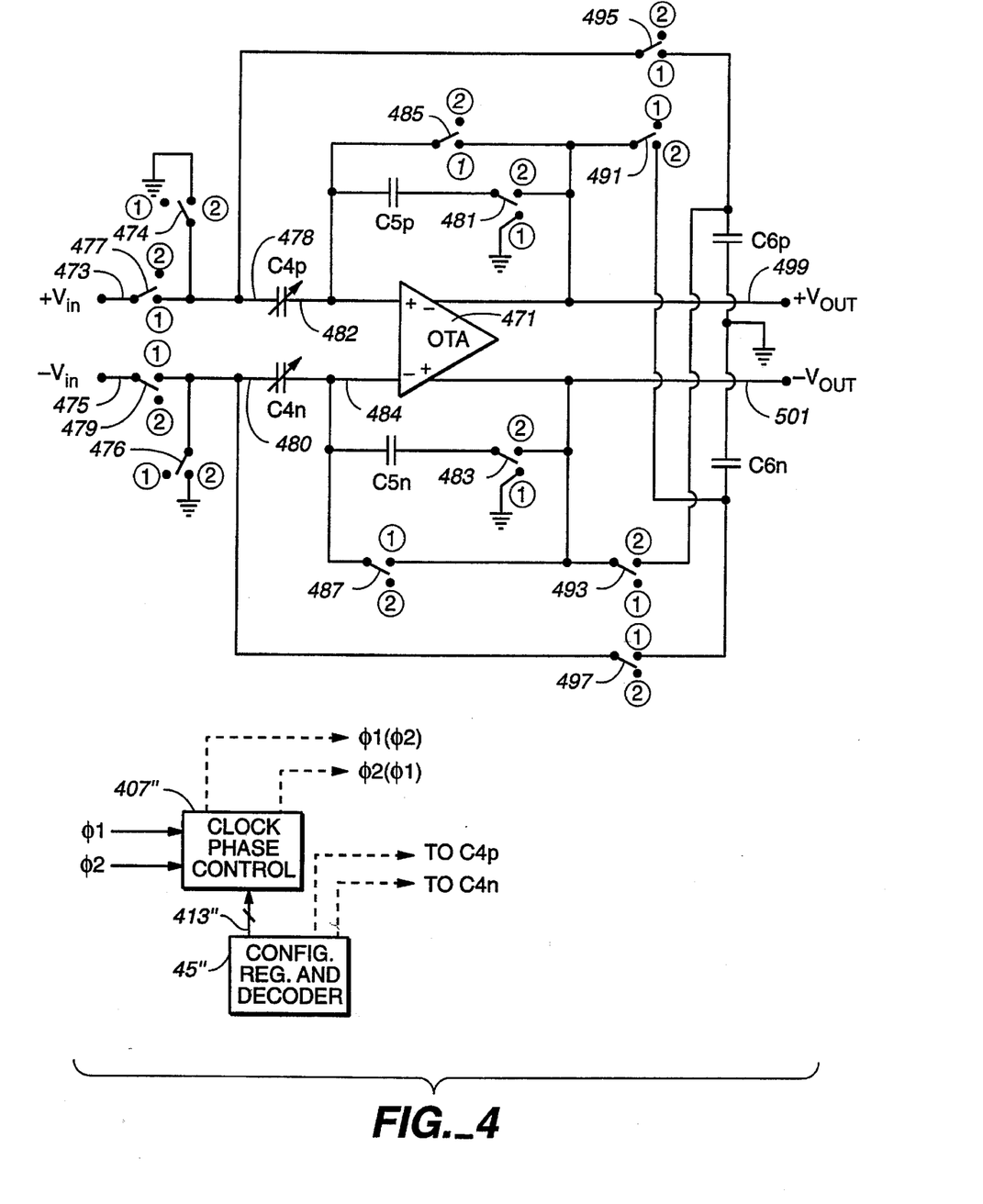
FIG. 4 is a schematic diagram of a second embodiment of a switched capacitor amplifier implementing the pre-charging feature of the present invention.
Figure 5A:
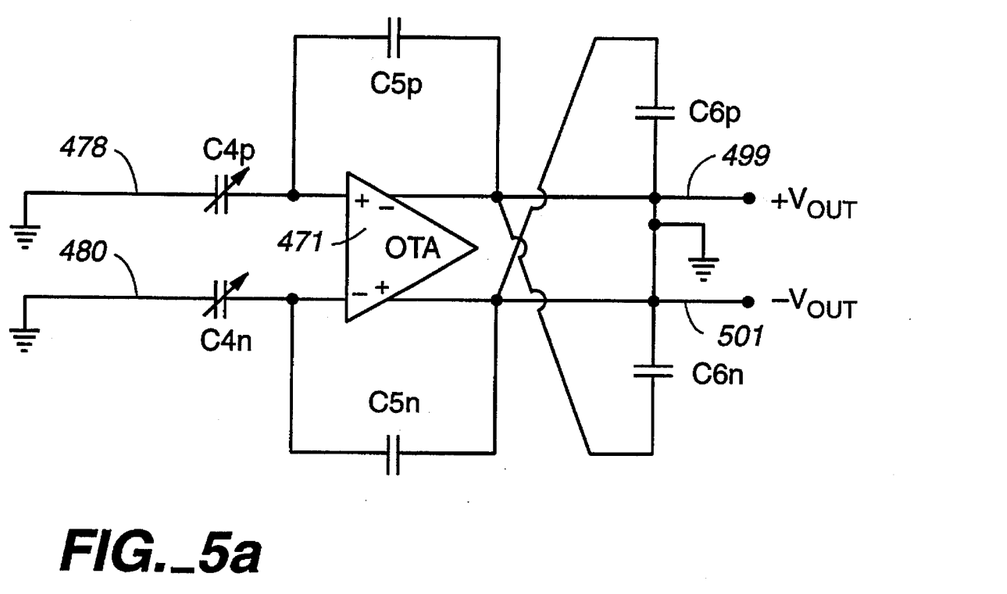
FIGS. 5a and 5b show the connections of the circuit of FIG. 4 during alternate clock phases.

During the clock phase $\phi2$, the switches within the circuit of FIG. 4 are set to form a circuit shown in FIG. 5a. The input switches 477 and 479 are opened, thereby disconnecting the circuit from the input lines 473 and 475. Lines 478 and 480 are grounded by switches 474 and 476 being grounded. Thus, one side of each of the input capacitors C4p and C4n is connected to ground. Feedback capacitors C5p and C5n are connected between respective input/output terminals of the OTA through respective switches 481 and 483. Switches 481 and 483 have no counterparts in the circuit of FIG. 3 but are provided so that the feedback capacitors can be positively grounded during the next clock phase $\phi1$. Switches 485 and 487 are opened during the clock phase $\phi2$, as are switches 495 and 497. The switches 491 and 493 are closed to connect pre-charge capacitors C6p and C6n between respective amplifier outputs and ground, thereby to charge the capacitors from the amplifier output. It is during this clock phase $\phi2$ that the output signal in lines 499 and 501 is valid. Thus, the pre-charge capacitors C6p and C6n are charged to the voltage outputs of the OTA 471, which are those of the input signal in the lines 473 and 475 during the $\phi1$ clock phase, when multiplied by the set gain A.

Figure 5B:
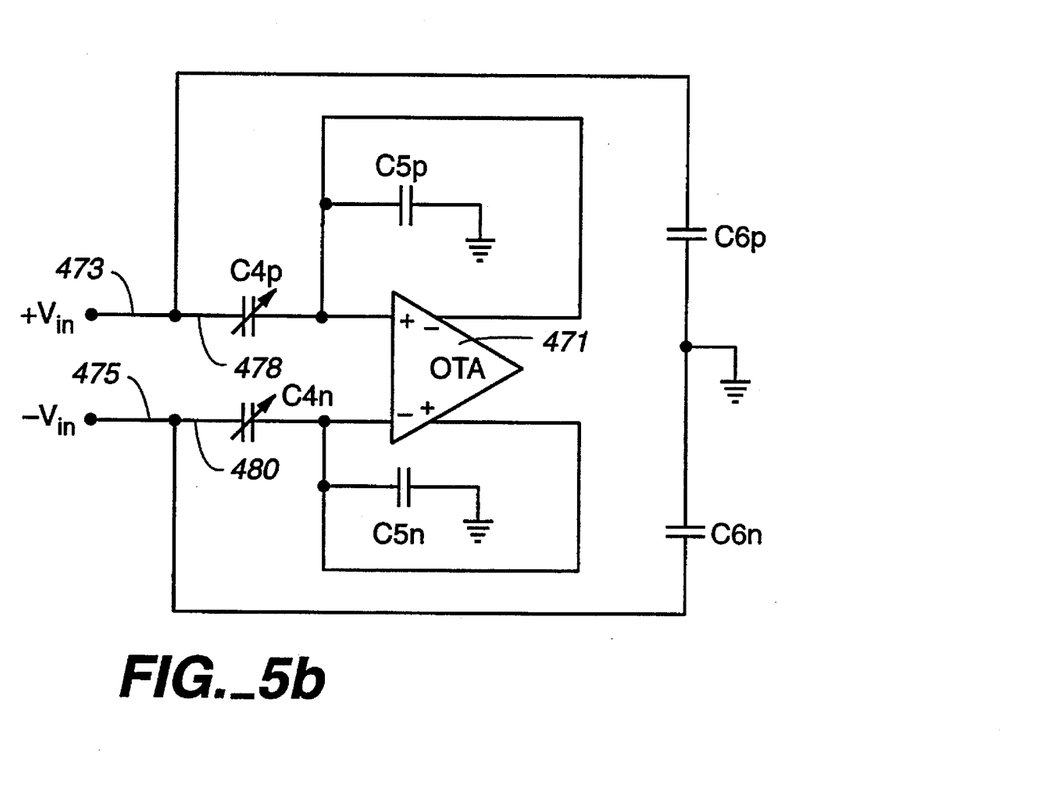

During the clock phase $\phi1$, as shown in FIG. 5b, all of these switches change to their opposite states. The input signals in lines 473 and 475 are connected across the input capacitors C4p and C4n, respectively, since the inputs of the OTA 471 are being maintained at a potential of analog ground. The pre-charging capacitors C6p and C6n are also connected across those respective input capacitors through closed switches 495 and 497. The feedback capacitors C5p and C5n are shorted to ground through respective switches 481 and 483, in order to completely discharge them during the $\phi1$ clock phase. The switches 491 and 493 are opened. The switches 485 and 487 are closed and thus connect respective inputs and outputs of the OTA 471 together.

Thus, generally, it can be seen that each of the input capacitors C4p and C4n receives a charge from two sources during the clock phase $\phi1$. One source is a respective one of the pre-charge capacitors C6p and C6n, and the other is the signal applied through input lines 473 and 480. As explained above with respect to FIG. 3, the input current through the lines 473 and 475 is thus limited to a small spike during an initial segment of the $\phi1$ phase, when charge is just beginning to be transferred from the pre-charge capacitors C6p and C6n to the input capacitors C4p and C4n, respectively, plus a continuing small current due to any difference between the voltage of the current input signal sample and that of the immediately prior sample that was stored in the pre-charge capacitors. Also, during the clock phase $\phi2$, any offset charge stored in the input capacitors C4p and C4n is removed since they are effectively shorted. As with the circuit of FIG. 3, each of the capacitors C6p, C6n, C5p and C5n are preferably made to have about the same value. The gain of the circuit of FIG. 4 is thus a ratio of the value of each of the input capacitors C4p and C4n, which are made to be the same, and the value of the feedback capacitors C5p and C5n, also the same.

It will be recognized that the switched capacitor circuits of FIGS. 3 and 4 can be modified and/or operated with different relative timing, while maintaining the input capacitor pre-charging feature to minimize input signal current. For example, the pre-charge capacitor can be connected to transfer charge to the input capacitor just prior to connecting the input signal to the pre-charge capacitor, rather than doing both during the same interval.

Figure 7:
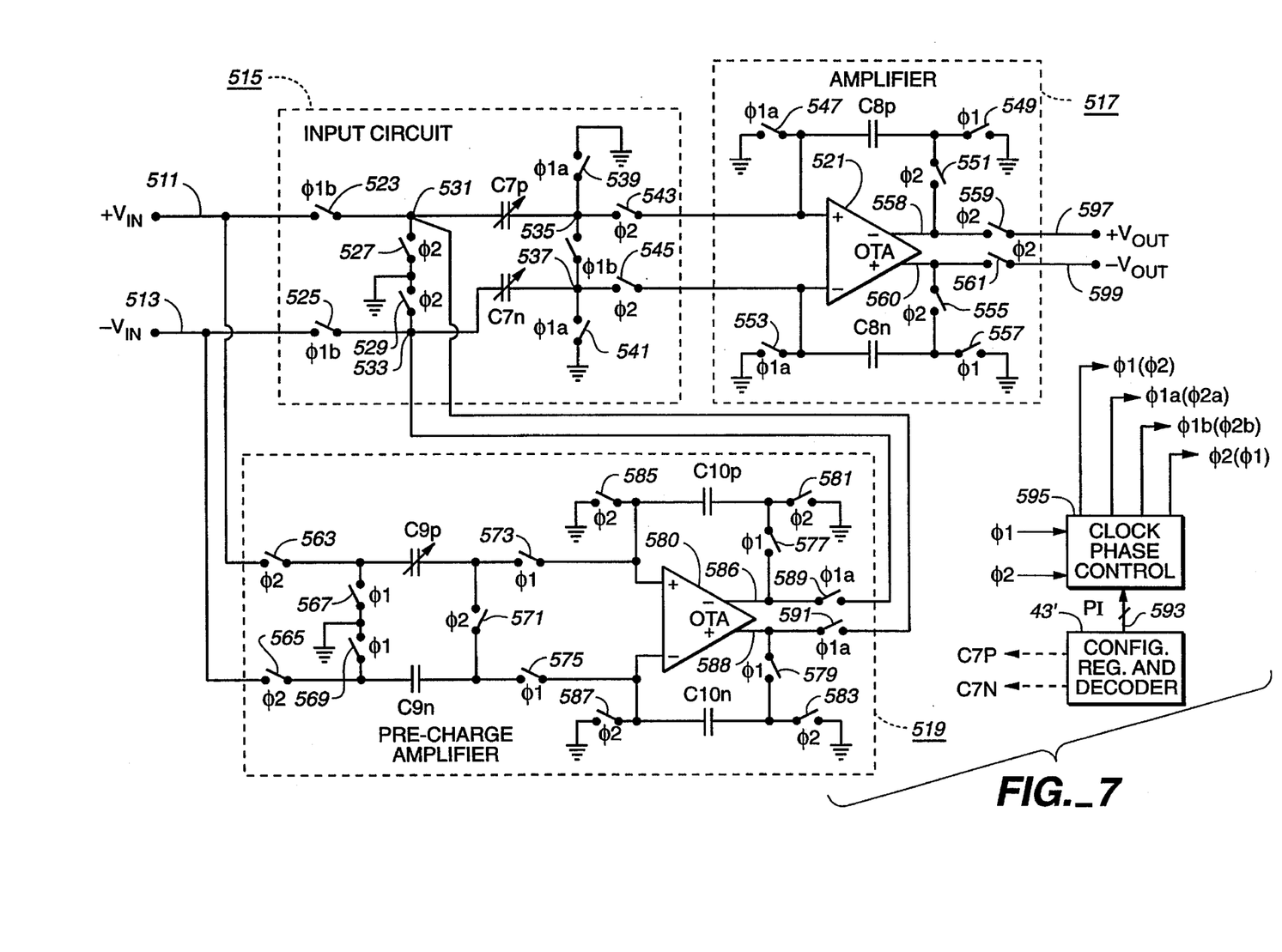
FIG. 7 is a schematic diagram of a third embodiment of a switched capacitor amplifier implementing the pre-charging feature of the present invention.
Figure 8:
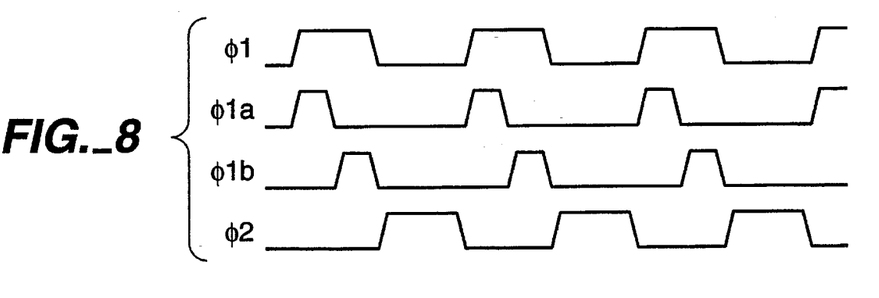
FIG. 8 is a timing diagram of the clock signals utilized in the embodiment of FIG. 7.

A different type of charge mode amplifier is shown in FIG. 7. In this circuit, in addition to utilizing the clock phases $\phi1$ and $\phi2$, the clock phase $\phi1$ is divided into two different clock signals $\phi1a$ and $\phi1b$. These clocks are shown in FIG. 8, where each of the signals is active when high to close a switch of the circuit of FIG. 7 to which the clock signal is applied. Noted by each of the switches of FIG. 7 is clock phase which causes the switch to close (become conductive), the switch being opened (non-conductive) at all other times. The clock signals are generated by a controlling circuit 595 with their relative phase controlled by a signal in lines 593 from a field of a configuration register 43'.

The amplifier of FIG. 7 pre-charges its input capacitors C7p and C7n within an input circuit 515 from a pre-charge amplifier 519. The output of the pre-charge amplifier 519 is applied during the clock phase $\phi1a$ to input nodes 531 and 533. During this interval, switches 589 and 591 of the pre-charge amplifier output are closed while switches 523 and 525 are opened to isolate these input nodes from the input signal in lines 511 and 513. Switches 539 and 541 are closed during the pre-charging phase $\phi1a$, thus connecting nodes 535 and 537, on opposite sides of input capacitors C7p and C7n, respectively, to ground potential. The amplifier circuit 517 is isolated from the input circuit during both the pre-charging phase $\phi1a$ and the input signal charging phase $\phi1b$ which occurs immediately after the pre-charging.

In the phase $\phi1b$, the pre-charge amplifier 519 is disconnected from the nodes 531 and 533 by the opening of its output switches 589 and 591. The input switches 523 and 525 are closed during this interval to apply the input signal to one side of the input capacitors C7p and C7n, respectively, their other sides remaining connected to ground through switches 539 and 541. Since the pre-charge amplifier has already pre-charged the input capacitors C7p and C7n to the value of the input signal during an immediately preceding clock phase $\phi2$, the only current flowing through the input lines 511 and 513 results from a change in the input signal between the current $\phi1b$ interval and the last $\phi2$ interval. This then provides a high impedance input with a low apparent input capacitance.

The pre-charge amplifier 519 acquires a charge in its input capacitors C9p and C9n from the input signal lines 511 and 513 during the clock phase $\phi2$ when its input switches 563 and 565, and a switch 571 across an opposite side of these capacitors, are all closed. Since these capacitors are fully discharged when their charge is transferred to respective feedback capacitors C10a and C10b during the clock phase $\phi1$, the input signal must provide all the charge to the capacitors C9p and C9n during the clock phase $\phi2$. If these capacitors are large, the input current in lines 511 and 513 during the clock phase $\phi2$ will be large and thus not provide the desired high impedance input, with low effective capacitance. However, the use of the pre-charge amplifier 519 allows the values of capacitors C9p and C9n, usually made the same, to be a very small fraction of the value of the capacitors C7p and C7n. Indeed, the value of each of the capacitors C9p and C9n is preferably made to be about 1/100 the smallest value of each of the adjustable capacitors C7p and C7n. A ratio of less than 1/25 is usually satisfactory. However, there is an improvement in the impedance at the input 511, 513 whenever the values of the individual capacitors C9p and C9n are significantly less than the values of the input capacitors C7p and C7n, such as one-third as much. This then results in the input current drawn by the pre-charge amplifier 519 to be very small, thereby providing the desired high impedance input at lines 511 and 513.

An OTA 580 within the pre-charge amplifier 519 of FIG. 7 provides an output voltage across nodes 531 and 533 during the clock phase φ1a that is proportional to the level of charge acquired by the input capacitors C9p and C9n during the preceding clock phase φ2. The OTA 580 is provided with the usual feedback capacitors C10p and C10n, which are connected across the OTA 580 by respective switches 577 and 579 during the clock phase φ1. During the clock phase φ2, these feedback capacitors are connected to ground potential by switches 581, 583, 585 and 587 in order to discharge them. The values of the feedback capacitors C10p and C10n are made to be the same, and also the same as the input capacitors C9p and C9n. The gain of the pre-charge amplifier 519 is thus one.

The amplifier 517 includes an OTA 521 and feedback capacitors C8p and C8n. During the clock phase φ2, charge is transferred from the input capacitors C7p and C7n to the respective feedback capacitors C8p and C8n through closed switches 543 and 545. Switches 551 and 555 are also closed during this phase to connect the feedback capacitors into the circuit. During remaining phases, these capacitors are connected to ground potential in order to discharge them. An output signal in lines 597 and 599 is valid during the clock phase φ2, when output switches 559 and 561 are closed.

An advantage of the circuit of FIG. 7 is that a fully differential output signal is generated in lines 597 and 599 from most any form of input voltage signal. The circuit of FIG. 7 can receive at its input lines 511 and 513 a fully differential signal, a single ended signal, or variations thereof. The specific circuit of FIG. 4, on the other hand, requires a fully differential input signal having a common mode within an input voltage window of its OTA 471, so is not usually suited for use in an input module. However, the circuit of FIG. 4 is simpler than that of FIG. 7, requiring fewer components and less integrated circuit space, so the circuit of FIG. 4 is preferred whenever it is suitable. Similarly, the circuit 3 is preferred for use with single ended voltage signals, when possible, rather than a single ended signal version of FIG. 7 which still includes a pre-charge amplifier but of a simpler single ended signal design.

Because the circuit of FIG. 7 disconnects the inputs of each of its OTAs 521 and 580 during their respective incoming signal sampling intervals, the charge of their respective pairs of input capacitors C7p, C7n and C9p, C9n does not include any offset voltage generated by the OTA itself. This may be distinguished from the circuit of FIG. 4 wherein the input capacitors C4p, C4n are charged by both the input signal and any offset voltage of the OTA 471 during its charge period φ1. The offset is then cancelled during the next phase φ2 when that charge is transferred to the feedback capacitors C5p, C5n. But in the circuit of FIG. 7, additional circuit elements are desirable in order to correct for the effect of offset voltages generated in the OTAs 521 and 580.

Figure 9:
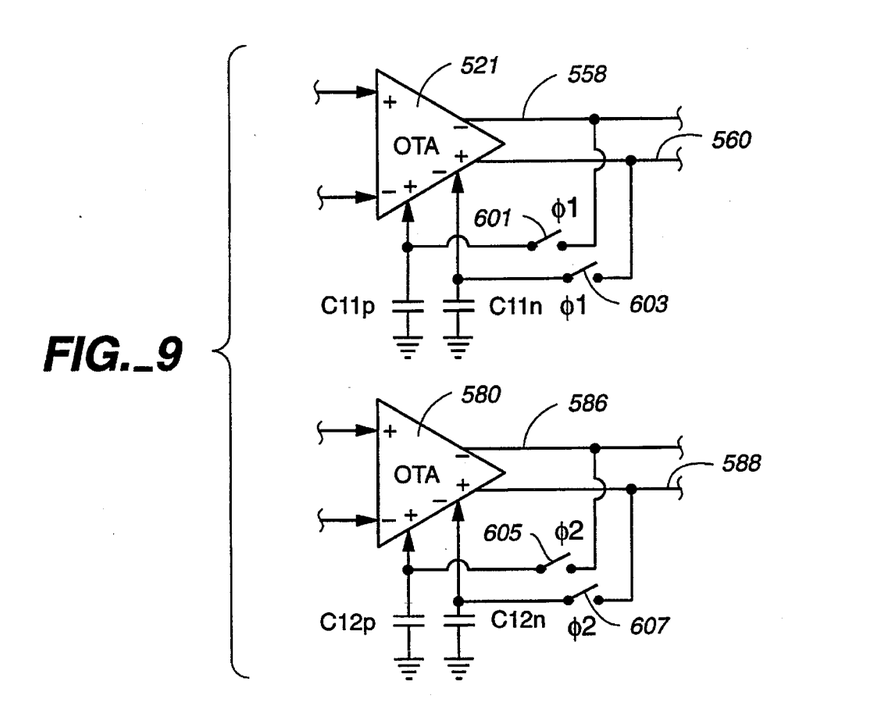
FIG. 9 schematically shows an addition to the circuit embodiment of FIG. 7.

Such offset correction circuits are shown in FIG. 9. Each of the OTAs has a second pair of signal inputs to which capacitors are connected to supply a voltage proportional to the offset of the OTA. For the OTA 521, capacitors C11p and C11n are connected, respectively, to the output lines 558 and 560 through switches 601 and 603. These switches are closed during the clock phase φ1, thus charging capacitors C11p and C11n to the output voltage of the OTA 521 when no signal is being applied to its inputs, those inputs being grounded through switches 547 and 553 (FIG. 7) during a portion φ1a of that charging period. During the phase φ2, when the OTA is receiving an input signal through closed switches 543 and 545, the voltage of the charged capacitors C11p and C11n (FIG. 9) is combined with the input signal to correct for the offset imparted by the OTA. The same correction given the OTA 580, charging capacitors C12p and C12n from the OTA output through respective switches 605 and 607 during the clock phase φ2 when its input lines are connected to ground through switches 585 and 587.

It will be recognized that the specific switched capacitor circuit of FIGS. 7–9 can be modified and/or operated with different relative timing, while maintaining the input capacitor pre-charging feature to minimize input signal current. For example, the pre-charge amplifier 519 could be connected to the input signal during the same period when the input capacitors C7p and C7n are so connected. Alternatively, as another example, the output of the pre-charge amplifier 519 could be connected to transfer charge to the input capacitors C7p and C7n simultaneously with the input signal being so connected. The pre-charging feature is also applicable to the circuit when modified to open and close its pair of switches 523, 525 and 543, 545 together during the same clock phase, rather than in alternate phases as described above. Charge is then transferred to the feedback capacitors C8p and C8n from the input capacitors C7p and C7n at the same time that the input capacitors are being charged from the input signal in lines 511 and 513. Many variations in the circuit and/or its operation are possible, depending upon the specific application of the circuit.

Although the present invention has been described with respect to its illustrative preferred embodiments, it will be understood that the invention is entitled to protection within the full scope of the appended claims.

It is claimed:

1. In a method of transferring packets of electronic charge through a circuit having an input capacitor connected to be periodically charged by an input signal and that charge transferred to another capacitor from which an output signal of the circuit is derived, the improvement of charging the input capacitor from a source of charge in addition to the input signal to a level approximating that of a current sample of the input signal, thereby to reduce the amount of charge required from the input signal, whereby the input impedance of the circuit is maintained high.

2. A method according to claim 1 wherein charging the input capacitor from a source of charge in addition to the input signal includes deriving that additional charge through a separate circuit from the input signal.

3. A method according to claim 1 wherein charging the input capacitor from a source of charge in addition to the input signal includes deriving that additional charge from the output signal.

4. An electronic circuit for processing an incoming signal to provide an outgoing signal, comprising:

means receiving said incoming signal for periodically charging an input capacitor to a level proportional to a magnitude of said incoming signal, means coupled to transfer charge from said input capacitor for periodically developing said outgoing signal with a magnitude related to a level of said transferred charge, and means including a source of charge in addition to the incoming signal for periodically charging the input capacitor to a level approximating that of the incoming signal, thereby reducing a level of contribution of the incoming signal to charging the input capacitor.

5. The circuit of claim 4 wherein said additional input capacitor charging means includes means responsive to the outgoing signal for providing said additional source of charge.

6. The circuit of claim 4 wherein said additional input capacitor charging means includes at least one pre-charging capacitor and means responsive to a clock signal for alternately connecting said pre-charging capacitor to be charged from the outgoing signal and to transfer that charge to said input capacitor.

7. The circuit of claim 4 wherein said additional input capacitor charging means includes means responsive to the incoming signal for providing said additional source of charge.

8. An electronic circuit for processing an incoming signal to provide an outgoing signal, comprising:

means receiving said incoming signal for periodically charging an input capacitor to a level proportional to a magnitude of said incoming signal, means coupled to transfer charge from said input capacitor for periodically developing said outgoing signal with a magnitude related to a level of said transferred charge, and means including a source of charge in addition to the incoming signal for periodically charging the input capacitor to a level approximating that of the incoming signal, thereby reducing a level of contribution of the incoming signal to charging the input capacitor, said additional input capacitor charging means including a switched capacitor amplifier having a pre-charging capacitor at an input thereof and which is periodically connected to be charged from the incoming signal, the value of capacitance of said pre-charging capacitor being less than one-third of the value of the capacitance of the input capacitor.

9. An electronic circuit for processing an incoming signal to provide an outgoing signal, comprising:

means receiving said incoming signal for periodically charging an input capacitor to a level proportional to a magnitude of said incoming signal, means coupled to transfer charge from said input capacitor for periodically developing said outgoing signal with a magnitude related to a level of said transferred charge, means including a source of charge in addition to the incoming signal for periodically charging the input capacitor to a level approximating that of the incoming signal, thereby reducing a level of contribution of the incoming signal to charging the input capacitor, and a source of a clock signal having at least first and second phases alternating in time in a substantially non-overlapping manner, and wherein the input capacitor charging means operates to receive said incoming signal during occurrences of the first clock signal phases, and further wherein said outgoing signal developing means operates to transfer charge from said input capacitor during occurrences of the second clock signal phases.

10. The circuit of claim 9 wherein said additional charging means further includes a pre-charging capacitor connected to be charged by the outgoing signal during the second clock signal phases and connected to transfer such charge to the input capacitor during a following of the first clock phases.

11. The circuit of claim 10 wherein said additional charging means includes means for providing a source of charge during the first clock signal phases simultaneously with the incoming signal, thereby to charge the input capacitor to the level approximating the incoming signal simultaneously with the incoming signal being connected with the input capacitor.

12. The circuit of claim 9 wherein said additional charging means includes means receiving said incoming signal during occurrences of the second clock signal phases for providing a source of charge to the input capacitor during the immediately following of the first clock signal phases.

13. The circuit of claim 12 wherein said additional charging means further includes a pre-charging capacitor connectable to receive the incoming signal during occurrences of the second clock signal phases, said pre-charging capacitor being separate from said input capacitor and having a value of capacitance that is less than one-third of the value of capacitance of the input capacitor.

14. The circuit of claim 4 wherein said means coupled to transfer charge from said input capacitor includes means for substantially discharging the input capacitor, whereby said means including a source of charge in addition to the incoming signal for periodically charging the input capacitor operates to restore a level of charge to the input capacitor that approximates that of the incoming signal.

15. The circuit of claim 4 which additionally includes means for controlling the size of the input capacitor, whereby a transfer function of said electronic circuit is controllable.

16. A method of processing an analog signal by repeating a cycle that comprises:

charging a first capacitor with a sample of the analog signal that occurs during a first interval of time, subsequently transferring the charge from the first capacitor to a second capacitor during a second interval of time that is substantially non-overlapping with said first interval of time, prior to the second interval of time, charging the input capacitor from a source of charge other than the analog signal sample to a level approximating that of a recent sample of the input signal, thereby to reduce the amount of charge required from the input signal during the first interval of time, and deriving an output signal from the charge on the second capacitor.

17. The method of claim 16, wherein charging the first capacitor from a source of charge other than the analog signal sample includes charging the input capacitor from the output signal.

18. The method of claim 17, wherein periodically charging the first capacitor from a source of charge from the output signal includes use of a third capacitor that is alternately connected to be charged by the output signal and discharged to the first capacitor.

19. The method of claim 16, wherein charging the first capacitor from a source of charge other than the analog signal sample includes use of a charge source not utilizing the second capacitor or the output signal but that is responsive to a recent value of the analog signal.

20. The method of claim 19, wherein charging the input capacitor from a source of charge other than the analog signal sample includes charging a fourth capacitor with another sample of the analog signal, wherein the fourth capacitor is chosen to have a value of capacitance that is less than one-third of the value of capacitance of the first capacitor.

21. The method of any one of claims 16–20, wherein charging the first capacitor from a source of charge other than the analog signal sample includes doing so simultaneously with charging the first capacitor by the sample of the analog signal during the first interval of time.

22. The method of any one of claims 16–20, wherein charging the first capacitor from a source of charge other than the analog signal sample includes doing so during a third interval of time in advance of and substantially non-overlapping with the first interval of time.

23. The method of any one of claims 16–20, wherein the first capacitor is substantially discharged after the first interval of time.

24. The method of any one of claims 16–20, which additionally comprises adjusting the relative values of the first and second capacitors, thereby to control a transfer characteristic of the analog signal processing.

* * * * *